(12) United States Patent
Li et al.

(10) Patent No.: US 9,577,594 B2
(45) Date of Patent: Feb. 21, 2017

(54) METHOD AND APPARATUS FOR EXCHANGING CONTROL FUNCTIONS OF VOLUME CONTROL UNITS, AND TERMINAL

(71) Applicant: Huawei Technologies Co., Ltd., Shenzhen, Guangdong (CN)

(72) Inventors: Xinxin Li, Shenzhen (CN); Dan Miao, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 150 days.

(21) Appl. No.: 14/490,936

(22) Filed: Sep. 19, 2014

(65) Prior Publication Data
US 2015/0139450 A1    May 21, 2015

(30) Foreign Application Priority Data

Nov. 21, 2013    (CN) .......................... 2013 1 0594832

(51) Int. Cl.
*H03G 3/00*    (2006.01)
*H03G 3/02*    (2006.01)
*G06F 3/16*    (2006.01)

(52) U.S. Cl.
CPC .............. *H03G 3/02* (2013.01); *G06F 3/165* (2013.01)

(58) Field of Classification Search
CPC ........ H04R 2430/01; H03G 3/02; G06F 3/02; G06F 3/048; G06F 3/165
USPC ......................................................... 381/109
See application file for complete search history.

(56) References Cited

U.S. PATENT DOCUMENTS 6,538,636 B1    3/2003    Harrison
2008/0068341 A1    3/2008    Abanami

FOREIGN PATENT DOCUMENTS

| CN | 1855273 A | 11/2006 |
| CN | 101517524 A | 8/2009 |
| EP | 1 710 658 A1 | 10/2006 |
| WO | WO 2008/033795 A1 | 3/2008 |

OTHER PUBLICATIONS

Aza Raskin, "Redesigning the iPhone's Buttons", Dec. 22, 2008.*

* cited by examiner

*Primary Examiner* — Paul S Kim
*Assistant Examiner* — Katherine Faley

(57) ABSTRACT

The present invention provides a method and an apparatus for exchanging control functions of volume control units, and a terminal, which relate to the field of communications technologies and can make it more convenient for a user to adjust volume. The method includes: obtaining current placement status information of the terminal, where the placement status information is used to indicate a current placement status of the terminal, and at least two volume control units are disposed in the terminal; and exchanging volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease.

6 Claims, 5 Drawing Sheets

METHOD AND APPARATUS FOR EXCHANGING CONTROL FUNCTIONS OF VOLUME CONTROL UNITS, AND TERMINAL

CROSS-REFERENCE TO RELATED APPLICATION

This application claims priority to Chinese Patent Application No. 201310594832.6, filed on Nov. 21, 2013, which is hereby incorporated by reference in its entirety.

TECHNICAL FIELD

The present invention relates to the field of communications technologies, and in particular, to a method and an apparatus for exchanging control functions of volume control units, and a terminal.

BACKGROUND

At present, a volume control unit such as a volume key is disposed in a terminal and is used to adjust volume of the terminal.

In the prior art, the volume key is usually designed on a side of the terminal, and normally two volume keys are disposed. One volume key is used to increase volume and the other volume key is used to decrease volume. A user needs to select a corresponding volume key when the user wants to adjust the volume of the terminal.

However, when a placement status of the terminal changes, for example, the terminal is rotated by a specific angle, because positions of the volume keys also change accordingly, before adjusting the volume, the user needs to determine, in a current placement status of the terminal, a position of the volume key for increasing the volume or for decreasing the volume, thereby causing inconvenience to the user's operations of adjusting the volume.

SUMMARY

Embodiments of the present invention provide a method and an apparatus for exchanging control functions of volume control units, and a terminal, which can make it more convenient for a user to adjust volume.

According to a first aspect of the present invention, a method for exchanging control functions of volume control units is provided, where the method includes:

obtaining current placement status information of a terminal, where the placement status information is used to indicate a current placement status of the terminal, and at least two volume control units are disposed in the terminal; and exchanging volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease.

In a first possible implementation manner of the first aspect, after the obtaining current placement status information of a terminal, the method further includes:

determining, according to the obtained placement status information, whether the current placement status of the terminal deviates from the normal placement status of the terminal.

With reference to the first possible implementation manner of the first aspect, in a second possible implementation manner of the first aspect, when a screen of the terminal is perpendicular to the horizontal plane, a placement status of the terminal is the normal placement status of the terminal;

the placement status information includes a deviation angle of the terminal, where the deviation angle is an included angle between a line of gravity and a median line of the terminal; and the determining, according to the obtained placement status information, whether the current placement status of the terminal deviates from the normal placement status of the terminal includes:

when the deviation angle of the terminal is greater than 0 degrees, determining that the current placement status of the terminal deviates from the normal placement status of the terminal.

With reference to the first possible implementation manner of the first aspect, in a third possible implementation manner of the first aspect, when a screen of the terminal tilts relative to the horizontal plane and a degree of inclination of the terminal is less than 45 degrees, a placement status of the terminal is the normal placement status of the terminal;

the placement status information includes a deviation angle of the terminal, where the deviation angle is an included angle between a line of gravity and a median line of the terminal; and the determining, according to the obtained placement status information, whether the current placement status of the terminal deviates from the normal placement status of the terminal specifically includes:

when the deviation angle of the terminal is greater than or equal to 45 degrees, determining that the current placement status of the terminal deviates from the normal placement status of the terminal.

With reference to the second possible implementation manner of the first aspect or the third possible implementation manner of the first aspect, in a fourth possible implementation manner of the first aspect, the exchanging volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease includes:

exchanging the volume control functions of the two volume control units when the current placement status of the terminal deviates from the normal placement status of the terminal, where the at least two volume control units include a first volume control subunit whose volume control function is to control volume to increase and a second volume control subunit whose volume control function is to control volume to decrease.

With reference to the second possible implementation manner of the first aspect or the third possible implementation manner of the first aspect, in a fifth possible implementation manner of the first aspect, the exchanging volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease includes:

exchanging the volume control functions of the at least two volume control units when the current placement status of the terminal deviates from the normal placement status of the terminal, where the at least two volume control units include a first volume control subunit whose volume control function is to control volume to increase, a second volume control subunit whose volume control function is to control volume to decrease, and a third volume control subunit whose volume control function is to control volume to mute.

With reference to the first possible implementation manner of the first aspect, in a sixth possible implementation manner of the first aspect, the placement status information includes a gravity sensing parameter (X, Y, Z) of the terminal, where X, Y, and Z indicate component values of gravity accelerations generated by the terminal in the X-axis direction, the Y-axis direction, and the Z-axis direction, respectively;

where when an included angle between a line of gravity and a median line of the terminal is 0 degrees, the gravity sensing parameter (X, Y, Z) of the terminal is (0, −10, 0), (0, 10, 0), (−10, 0, 0), or (10, 0, 0); and the determining, according to the obtained placement status information, whether the current placement status of the terminal deviates from the normal placement status of the terminal includes:

when the gravity sensing parameter (X, Y, Z) is (0, −10, 0), (0, 10, 0), (−10, 0, 0), or (10, 0, 0), determining that the current placement status of the terminal is the normal placement status of the terminal.

With reference to the first possible implementation manner of the first aspect, in a seventh possible implementation manner of the first aspect, the placement status information includes a gravity sensing parameter (X, Y, Z) of the terminal, where X, Y, and Z indicate component values of gravity accelerations generated by the terminal in the X-axis direction, the Y-axis direction, and the Z-axis direction, respectively;

where when an included angle between a line of gravity and a median line of the terminal is less than 45 degrees, in the gravity sensing parameter (X, Y, Z) of the terminal, a Y value is greater than −5 and less than 5, or an X value is greater than −5 and less than 5; and the determining, according to the obtained placement status information, whether the current placement status of the terminal deviates from the normal placement status of the terminal includes:

when in the gravity sensing parameter (X, Y, Z), the Y value is greater than −5 and less than 5, or the X value is greater than −5 and less than 5, determining that the current placement status of the terminal is the normal placement status of the terminal.

With reference to the sixth possible implementation manner of the first aspect or the seventh possible implementation manner of the first aspect, in an eighth possible implementation manner of the first aspect, the exchanging volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease includes:

exchanging the volume control functions of the two volume control units when the current placement status of the terminal deviates from the normal placement status of the terminal, where the at least two volume control units include a first volume control subunit whose volume control function is to control volume to increase and a second volume control subunit whose volume control function is to control volume to decrease.

With reference to the sixth possible implementation manner of the first aspect or the seventh possible implementation manner of the first aspect, in a ninth possible implementation manner of the first aspect, the exchanging volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease includes:

exchanging the volume control functions of the at least two volume control units when the current placement status of the terminal deviates from the normal placement status of the terminal, where the at least two volume control units include a first volume control subunit whose volume control function is to control volume to increase, a second volume control subunit whose volume control function is to control volume to decrease, and a third volume control subunit whose volume control function is to control volume to mute.

According to a second aspect of the present invention, an apparatus for exchanging control functions of volume control units is provided, where the apparatus includes:

an obtaining unit, configured to obtain current placement status information of a terminal, where the placement status information is used to indicate a current placement status of the terminal, and at least two volume control units are disposed in the terminal; and an exchanging unit, configured to exchange volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease.

In a first possible implementation manner of the second aspect, the apparatus further includes:

a determining unit, configured to determine, according to the placement status information obtained by the obtaining unit, whether the current placement status of the terminal deviates from the normal placement status of the terminal.

With reference to the first possible implementation manner of the second aspect, in a second possible implementation manner of the second aspect, when a screen of the terminal is perpendicular to the horizontal plane, a placement status of the terminal is the normal placement status of the terminal;

the placement status information includes a deviation angle of the terminal, where the deviation angle is an included angle between a line of gravity and a median line of the terminal; and the determining unit is specifically configured to:

when the deviation angle of the terminal is greater than 0 degrees, determine that the current placement status of the terminal deviates from the normal placement status of the terminal.

With reference to the first possible implementation manner of the second aspect, in a third possible implementation manner of the second aspect, when a screen of the terminal tilts relative to the horizontal plane and a degree of inclination of the terminal is less than 45 degrees, a placement status of the terminal is the normal placement status of the terminal;

the placement status information includes a deviation angle of the terminal, where the deviation angle is an included angle between a line of gravity and a median line of the terminal; and the determining unit is specifically configured to:

when the deviation angle of the terminal is greater than or equal to 45 degrees, determine that the current placement status of the terminal deviates from the normal placement status of the terminal.

With reference to the second possible implementation manner of the second aspect or the third possible implementation manner of the second aspect, in a fourth possible implementation manner of the second aspect, the exchanging unit is specifically configured to:

exchange the volume control functions of the two volume control units when the current placement status of the terminal deviates from the normal placement status of the terminal, where the at least two volume control units include a first volume control subunit whose volume control function is to control volume to increase and a second volume control subunit whose volume control function is to control volume to decrease.

With reference to the second possible implementation manner of the second aspect or the third possible implementation manner of the second aspect, in a fifth possible implementation manner of the second aspect, the exchanging unit is specifically configured to:

exchange the volume control functions of the at least two volume control units when the current placement status of the terminal deviates from the normal placement status of the terminal, where the at least two volume control units include a first volume control subunit whose volume control function is to control volume to increase, a second volume control subunit whose volume control function is to control volume to decrease, and a third volume control subunit whose volume control function is to control volume to mute.

With reference to the first possible implementation manner of the second aspect, in a sixth possible implementation manner of the second aspect, the placement status information includes a gravity sensing parameter (X, Y, Z) of the terminal, where X, Y, and Z indicate component values of gravity accelerations generated by the terminal in the X-axis direction, the Y-axis direction, and the Z-axis direction, respectively;

where when an included angle between a line of gravity and a median line of the terminal is 0 degrees, the gravity sensing parameter (X, Y, Z) of the terminal is (0, −10, 0), (0, 10, 0), (−10, 0, 0), or (10, 0, 0); and the determining unit is specifically configured to:

when the gravity sensing parameter (X, Y, Z) is (0, −10, 0), (0, 10, 0), (−10, 0, 0), or (10, 0, 0), determine that the current placement status of the terminal is the normal placement status of the terminal.

With reference to the first possible implementation manner of the second aspect, in a seventh possible implementation manner of the second aspect, the placement status information includes a gravity sensing parameter (X, Y, Z) of the terminal, where X, Y, and Z indicate component values of gravity accelerations generated by the terminal in the X-axis direction, the Y-axis direction, and the Z-axis direction, respectively;

where when an included angle between a line of gravity and a median line of the terminal is less than 45 degrees, in the gravity sensing parameter (X, Y, Z) of the terminal, a Y value is greater than −5 and less than 5, or an X value is greater than −5 and less than 5; and the determining unit is specifically configured to:

when in the gravity sensing parameter (X, Y, Z), the Y value is greater than −5 and less than 5, or the X value is greater than −5 and less than 5, determine that the current placement status of the terminal is the normal placement status of the terminal.

With reference to the sixth possible implementation manner of the second aspect or the seventh possible implementation manner of the second aspect, in an eighth possible implementation manner of the second aspect, the exchanging unit is specifically configured to:

exchange the volume control functions of the two volume control units when the current placement status of the terminal deviates from the normal placement status of the terminal, where the at least two volume control units include a first volume control subunit whose volume control function is to control volume to increase and a second volume control subunit whose volume control function is to control volume to decrease.

With reference to the sixth possible implementation manner of the second aspect or the seventh possible implementation manner of the second aspect, in a ninth possible implementation manner of the second aspect, the exchanging unit is specifically configured to:

exchange the volume control functions of the at least two volume control units when the current placement status of the terminal deviates from the normal placement status of the terminal, where the at least two volume control units include a first volume control subunit whose volume control function is to control volume to increase, a second volume control subunit whose volume control function is to control volume to decrease, and a third volume control subunit whose volume control function is to control volume to mute.

According to a third aspect of the present invention, a terminal is provided, where the terminal includes at least two volume control units and the apparatus for exchanging control functions of volume control units according to the second aspect or any one implementation manner of the possible implementation manners of the second aspect, where the at least two volume control units include a volume control unit whose volume control function is to control volume to increase and a volume control unit whose volume control function is to control volume to decrease.

In a method and an apparatus for exchanging control functions of volume control units, and the terminal provided by the embodiments of the present invention, firstly, current placement status information of a terminal is obtained, where the placement status information is used to indicate a current placement status of the terminal, and at least two volume control units are disposed in the terminal; then, volume control functions of the at least two volume control units are exchanged when the current placement status of the terminal deviates from a normal placement status of the terminal, where the at least two volume control units include a volume control unit whose volume control function is to control volume to increase and a volume control unit whose volume control function is to control volume to decrease. In the prior art, a user needs to, if control functions of volume control units are fixed and before adjusting volume, determine, in a current placement status of the terminal, a specific position of a volume control unit for increasing volume or for decreasing volume. It can be learned from the foregoing description that, unlike the prior art, a manner of exchanging the control functions of the volume control units, the control functions of the volume control units change along with the placement status of the terminal, thereby making it convenient for the user to adjust volume.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
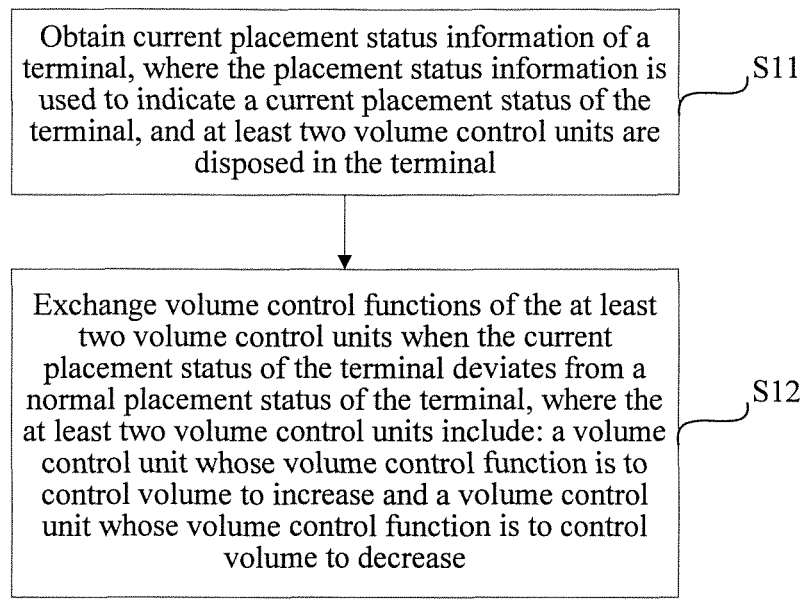
FIG. 1 is a flowchart of a method for exchanging control functions of volume control units according to a first embodiment of the present invention.

A first embodiment of the present invention provides a method for exchanging control functions of volume control units, which is performed by a terminal, specifically, performed by an apparatus for exchanging control functions of volume control units in the terminal; as shown in FIG. 1, the method may include the following steps:

S11. Obtain current placement status information of the terminal, where the placement status information is used to indicate a current placement status of the terminal, and at least two volume control units are disposed in the terminal.

It should be noted first that in this embodiment of the present invention, the terminal may be any device having a volume control function, such a mobile phone, a notebook computer, or a PAD (tablet computer).

In this embodiment of the present invention, the placement status information is one or more groups of values used to indicate a placement status of the terminal. The placement status information may have the following two compositions: the first is that the placement status information includes a deviation angle of the terminal, where the deviation angle is an included angle between a line of gravity and a median line of the terminal; and the second is that the placement status information may further include a gravity sensing parameter (X, Y, Z) of the terminal, where X, Y, and Z indicate component values of gravity accelerations generated by the terminal in the X-axis direction, the Y-axis direction, and the Z-axis direction, respectively.

For example, with reference to the placement status information of the first composition manner, when the terminal is placed perpendicular to the horizontal plane, the deviation angle of the terminal may be zero; and when the terminal is placed in a manner of tilting relative to the horizontal plane, the deviation angle of the terminal may be 30 degrees or 50 degrees. For another example, with reference to the placement status information of the second composition manner, when the terminal is placed perpendicular to the horizontal plane and in a vertical direction and upside-up manner, the gravity sensing parameter (X, Y, Z) may be (0, −10, 0); when the terminal is placed perpendicular to the horizontal plane and in a vertical direction and upside-down manner, the gravity sensing parameter (X, Y, Z) may be (0, 10, 0); and when the terminal is placed in a manner of tilting relative to the horizontal plane, the gravity sensing parameter (X, Y, Z) may be (−1, −9, −2).

It should be noted that the placement status information may further include a placement status identifier of the terminal. The placement status identifier corresponds to the gravity sensing parameter (X, Y, Z). For example, when the gravity sensing parameter (X, Y, Z) of the terminal is (0, −10, 0), the placement status identifier of the terminal may be set to 0; and when the gravity sensing parameter (X, Y, Z) of the terminal is (0, 10, 0), the placement status identifier of the terminal may be set to 1. For settings of a value of the gravity sensing parameter (X, Y, Z) and a change rule thereof, or settings of a value of the placement status identifier, reference may be made to the prior art or experience of a skilled person in the field, which is not specifically limited in the present invention.

It may be understood that, for the placement status information, a gravity sensing unit disposed in the terminal may be used to obtain a current deviation angle or gravity sensing parameter of the terminal. Specifically, the gravity sensing unit senses a current placement status of the terminal, thereby obtaining a corresponding gravity sensing parameter. The gravity sensing unit may obtain the current deviation angle or gravity sensing parameter of the terminal at an interval of preset duration, where a value of the preset duration may be set by a user or a terminal system, and may be set to, for example, 0.5 s, 1 s, or 2 s, which is not limited in the present invention. Alternatively, the gravity sensing unit may also obtain the deviation angle or gravity sensing parameter of the terminal when the user sends an instruction for adjusting volume of the terminal. The present invention does not specifically limit how the gravity sensing unit obtains the deviation angle or gravity sensing parameter of the terminal.

It should be noted that, in a specific application, the foregoing gravity sensing unit for obtaining the deviation angle or gravity sensing parameter of the terminal may be a gravity sensor, a gyroscope, or another sensor capable of generating a gravity sensing parameter, which is not limited in the present invention.

Optionally, the placement status of the terminal is described relative to the horizontal plane. For example, in this embodiment of the present invention, a placement status in which a user normally holds a terminal is used as a relative vertical-direction and upside-up state, and the placement status of the terminal may be classified into a vertical-direction and upside-up state, a vertical-direction and upside-down state, a transverse-direction and upside-up state, a transverse-direction and upside-down state, and a horizontal placement state. Specifically, in this embodiment of the present invention, because placement statuses of the terminal are different, values of X, Y, and Z in the obtained gravity sensing parameter (X, Y, Z) may change randomly. In an actual application, a range of parameters X, Y, and Z is set so that one or more deviation angles or gravity sensing parameters (X, Y, Z) correspond to a same placement status of the terminal. For example, for the gravity sensing parameter (X, Y, Z) of which X, Y, or Z changes within a specific value range, it may be considered that placement statuses, of the terminal, corresponding to these gravity sensing parameters (X, Y, Z) are the same.

S12. Exchange volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease.

Optionally, in a specific embodiment of the present invention, volume control functions of two volume control units are exchanged when the current placement status of the terminal deviates from the normal placement status of the terminal, where the at least two volume control units include a first volume control subunit whose volume control function is to control volume to increase and a second volume control subunit whose volume control function is to control volume to decrease.

Specifically, as shown in FIG. 2 to FIG. 5, two volume control subunits are disposed in the terminal; in an embodiment of the present invention, the two volume control subunits may include a first volume control subunit 1 and a second volume control subunit 2. One volume control subunit is configured to control volume to increase, and the other volume control subunit is configured to control volume to decrease.

If two volume control subunits are disposed in the terminal, a specific rule needs to be followed for exchanging the volume control functions of the volume control units. The rule may be set according to habits of most users. At present, most users are used to setting a volume control subunit that is relatively on the upper side or on the right side to volume increasing, and setting a volume control subunit that is relatively on the lower side or on the left side to volume decreasing. Therefore, in this embodiment of the present invention, the rule of exchanging the volume control functions of the volume control units may be set to "using a volume control subunit that is relatively on the upper side or on the right side to control volume to increase, and using a volume control subunit that is relatively on the lower side or on the left side to control volume to decrease". Certainly, for some users having different or even opposite use habits, the setting may be made by the users according to their habits; for example, the volume control subunit that is relatively on the upper side or on the right side is set to be used to control volume to decrease, and the volume control subunit that is relatively on the lower side or on the left side is set to be used to control volume to increase, which is not limited in the present invention. However, on a same terminal, the volume control subunit used to increase volume and a volume control subunit used to decrease volume are relatively fixed. In this embodiment of the present invention, an example in which "a volume control subunit that is relatively on the upper side or on the right side is always used to control volume to increase, and a volume control subunit that is relatively on the lower side or on the left side is always used to control volume to decrease" is used for description.

Figure 2:
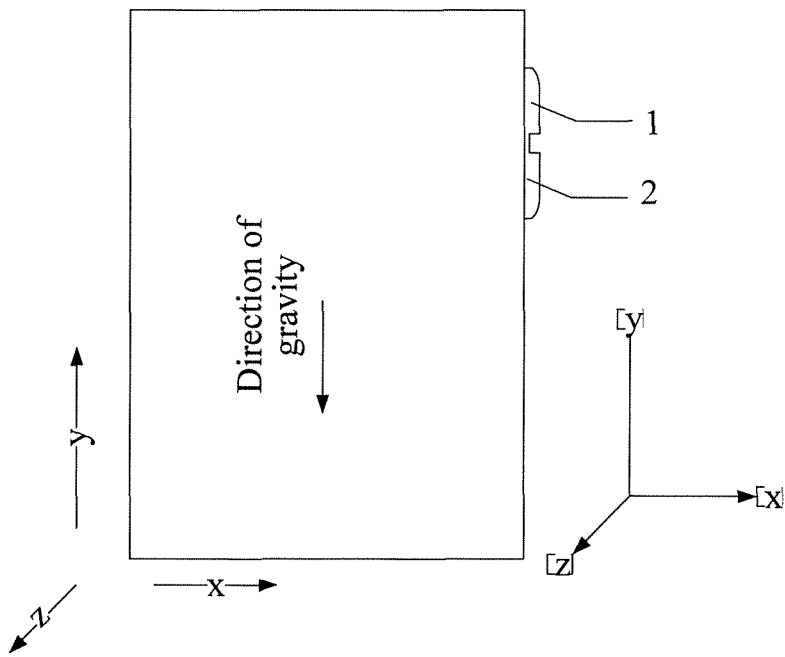
FIG. 2 is an exemplary schematic diagram of a terminal that is placed in a vertical direction and upside-up manner in a method for exchanging control functions of volume control units shown in FIG. 1.
Figure 3:
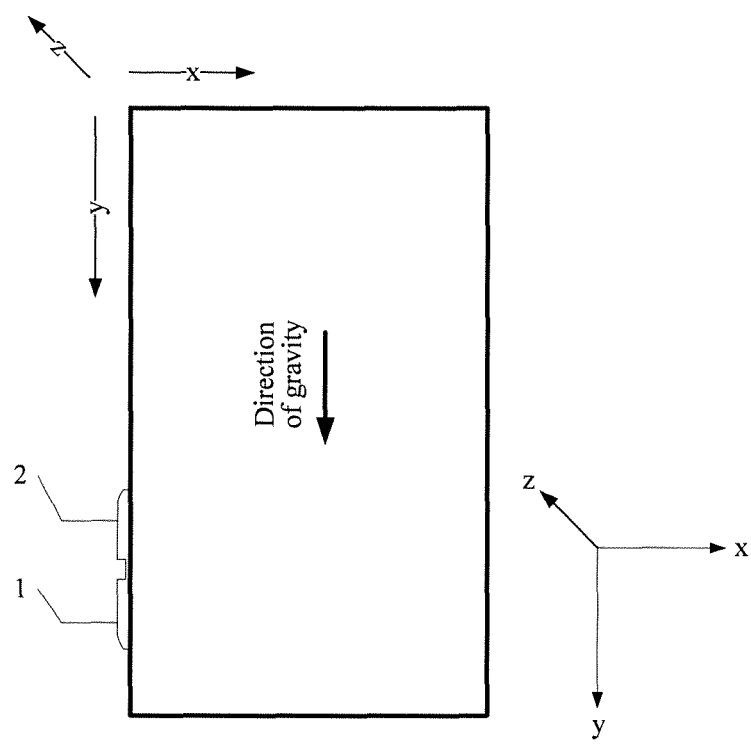
FIG. 3 is an exemplary schematic diagram of a terminal that is placed in a vertical direction and upside-down manner in a method for exchanging control functions of volume control units shown in FIG. 1.
Figure 4:
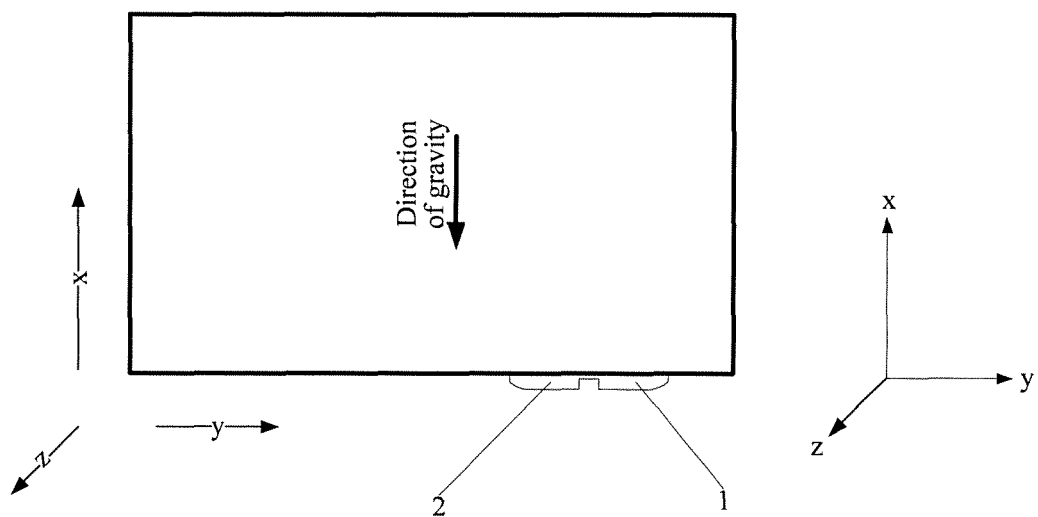
FIG. 4 is an exemplary schematic diagram of a terminal that is placed in a transverse direction and upside-up manner in a method for exchanging control functions of volume control units shown in FIG. 1.
Figure 5:
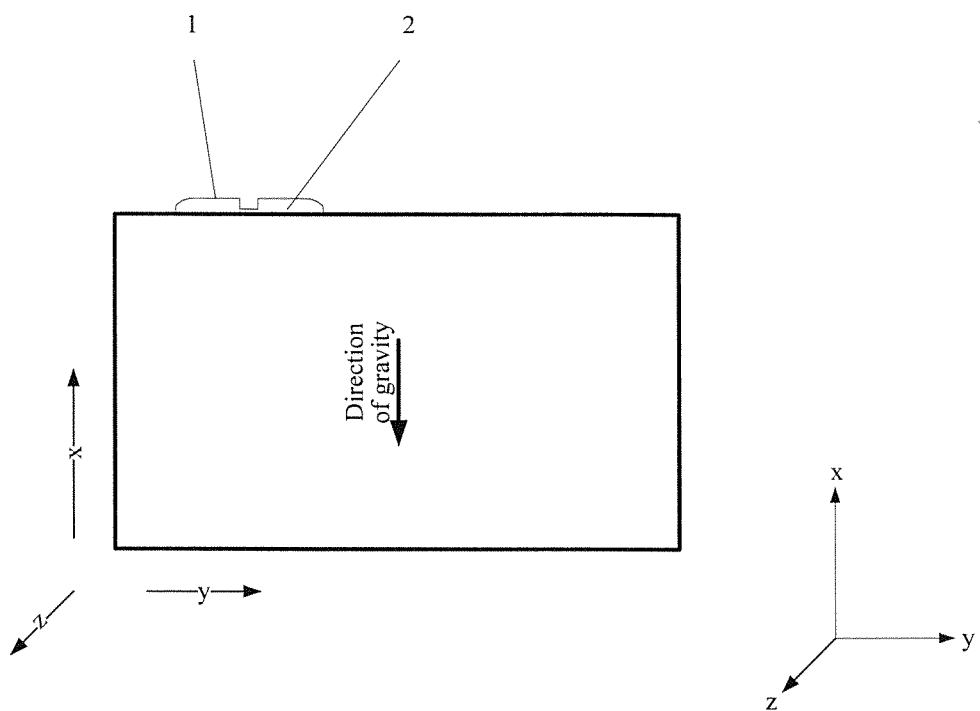
FIG. 5 is an exemplary schematic diagram of a terminal that is placed in a transverse direction and upside-down manner in a method for exchanging control functions of volume control units shown in FIG. 1.

For example, according to the foregoing rule for exchanging the volume control functions of the volume control units, the exchanging the volume control functions of the volume control units according to the obtained placement status information may be classified into the following cases:

Case 1: as shown in FIG. 2, the first volume control subunit 1 is exchanged to control volume to increase, and the second volume control subunit 2 is exchanged to control volume to decrease. Case 2: as shown in FIG. 3, the first volume control subunit 1 is exchanged to control volume to decrease, and the second volume control subunit 2 is exchanged to control volume to increase. Case 3: as shown in FIG. 4, the first volume control subunit 1 is exchanged to control volume to increase, and the second volume control subunit 2 is exchanged to control volume to decrease. Case 4: as shown in FIG. 5, the first volume control subunit 1 is exchanged to control volume to decrease, and the second volume control subunit 2 is exchanged to control volume to increase. Case 5: current volume control functions of the first volume control subunit 1 and the second volume control subunit 2 are used as the volume control functions of the first volume control subunit 1 and the second volume control subunit 2.

In addition, when the gravity sensing parameter of the terminal cannot be obtained by using the gravity sensing unit in the terminal (for example, when the gravity sensing unit is disabled or fails), the current volume control functions of the first volume control subunit 1 and the second volume control subunit 2 are used as the volume control functions of the first volume control subunit 1 and the second volume control subunit 2.

Optionally, in a specific embodiment of the present invention, the volume control functions of the at least two volume control units are exchanged when the current placement status of the terminal deviates from the normal placement status of the terminal, where the at least two volume control units include a first volume control subunit whose volume control function is to control volume to increase, a second volume control subunit whose volume control function is to control volume to decrease, and a third volume control subunit whose volume control function is to control volume to mute.

Specifically, three volume control subunits are disposed in the terminal, where the three volume control subunits may include a first volume control subunit 1, a second volume control subunit 2, and a third volume control subunit 3. One volume control subunit is used to control volume to increase, one volume control subunit is used to control volume to decrease, and the other volume control subunit is used to control volume to mute.

If three volume control subunits are disposed in the terminal, a certain rule also needs to be followed for exchanging the volume control functions of the volume control units. As described above, the rule may be set according to habits of most users. For example, at present, most users are used to setting a volume control subunit that is relatively on the upper side or on the right side to control volume to mute, setting a volume control subunit in the middle to control volume to increase, and setting a volume control subunit on the lower side or on the left side to control volume to decrease. Therefore, in this embodiment of the present invention, the rule of exchanging the volume control functions of the volume control units may be set to "using a volume control subunit that is relatively on the upper side or on the right side to control volume to mute, using a volume control subunit in the middle to control volume to increase, and using a volume control subunit that is relatively on the lower side or on the left side to control volume to decrease". Certainly, for some users having different or even opposite use habits, the setting may be made by the users according to their habits; for example, the volume control subunit that is relatively on the upper side or on the right side is used to control volume to increase, the volume control subunit in the middle is used to control volume to decrease, and the volume control subunit that is relatively on the lower side or on the left side is used to control volume to mute, which is not limited in the present invention.

In addition, in this embodiment of the present invention, that two or more volume control subunits are disposed as volume control units is merely used to describe how to implement the method for exchanging the volume control functions of the terminal; the volume control units are not limited to be set to be two or three volume control subunits. For example, one knob-type volume control subunit may also be set as a volume control unit, where the knob-type volume control subunit is capable of rotating in a specific direction to increase or decrease volume. Alternatively, in a specific application, the volume control unit may be a volume key. A setting form of the volume control unit is not limited in the present invention.

It can be learned from the foregoing description that, unlike the prior art in which volume keys are permanently used to increase or decrease volume, in this embodiment of the present invention, regardless of a change in the placement status of the terminal, the rule that "a volume control unit that is relatively on the upper side or on the right side is always used to control volume to increase, and a volume control unit that is relatively on the lower side or on the left side is always used to control volume to decrease" may always be followed to exchange the volume control functions of the terminal.

It may be understood that the foregoing manner of exchanging the volume control functions is especially suitable for a terminal of which a screen is designed without a frame.

In a method for exchanging control functions of volume control units provided by the first embodiment of the present invention, firstly, current placement status information of a terminal is obtained, where the placement status information is used to indicate a current placement status of the terminal, and at least two volume control units are disposed in the terminal; then, volume control functions of the at least two volume control units are exchanged when the current placement status of the terminal deviates from a normal placement status of the terminal, where the at least two volume control units include a volume control unit whose volume control function is to control volume to increase and a volume control unit whose volume control function is to control volume to decrease. In the prior art, a user needs to, if control functions of volume control units are fixed and before adjusting volume, determine, in a current placement status of the terminal, a specific position of a volume control unit for increasing volume or for decreasing volume. It can be learned from the foregoing description that, unlike the prior art, a manner of exchanging the control functions of the volume control units, the control functions of the volume control units change along with the placement status of the terminal, thereby making it convenient for the user to adjust volume.

Optionally, in an embodiment of the present invention, after the obtaining current placement status information of the terminal, the method may further include the following step: determining, according to the obtained placement status information, whether the current placement status of the terminal deviates from the normal placement status of the terminal.

The normal placement status in this embodiment of the present invention may have the following two definitions: the first is that when a screen of the terminal is perpendicular to the horizontal plane, a placement status of the terminal is the normal placement status of the terminal; and the second is that when a screen of the terminal tilts relative to the horizontal plane and a degree of inclination of the terminal is less than 45 degrees, a placement status of the terminal is the normal placement status of the terminal.

Specifically, when the placement status information is the deviation angle of the terminal, in a case of the first definition of the normal placement status, the determining, according to the obtained placement status information, whether the current placement status of the terminal deviates from the normal placement status of the terminal specifically is: when the deviation angle of the terminal is greater than 0 degrees, determining that the current placement status of the terminal deviates from the normal placement status of the terminal; otherwise, determining that the current placement status of the terminal is the normal placement status of the terminal.

Specifically, when the placement status information is the deviation angle of the terminal, in a case of the second definition of the normal placement status, the determining, according to the obtained placement status information, whether the current placement status of the terminal deviates from the normal placement status of the terminal specifically is: when the deviation angle of the terminal is greater than or equal to 45 degrees, determining that the current placement status of the terminal deviates from the normal placement status of the terminal; otherwise, determining that the current placement status of the terminal is the normal placement status of the terminal.

Specifically, when the placement status information is the gravity sensing parameter (X, Y, Z) of the terminal, in a case of the first definition of the normal placement status, that is, when the included angle between the line of gravity and the median line of the terminal is 0 degrees, the gravity sensing parameter (X, Y, Z) of the terminal is (0, −10, 0), (0, 10, 0), (−10, 0, 0), or (10, 0, 0).

In this case, the determining, according to the obtained placement status information, whether the current placement status of the terminal deviates from the normal placement status of the terminal specifically is: when the gravity sensing parameter (X, Y, Z) is (0, −10, 0), (0, 10, 0), (−10, 0, 0), or (10, 0, 0), determining that the current placement status of the terminal is the normal placement status of the terminal; otherwise, determining that the current placement status of the terminal deviates from the normal placement status.

Specifically, when the placement status information is the gravity sensing parameter (X, Y, Z) of the terminal, in a case of the second definition of the no/mal placement status, that is, when the included angle between the line of gravity and the median line of the terminal is less than 45 degrees, in the gravity sensing parameter (X, Y, Z) of the terminal, a Y value is greater than −5 and less than 5, or an X value is greater than −5 and less than 5.

In this case, the determining, according to the obtained placement status information, whether the current placement status of the terminal deviates from the normal placement status of the terminal specifically is: when the Y value is greater than −5 and less than 5, or the X value is greater than −5 and less than 5 in the gravity sensing parameter (X, Y, Z), determining that the current placement status of the terminal is the no/mal placement status of the terminal; otherwise, determining that the current placement status of the terminal deviates from the normal placement status.

Figure 6:
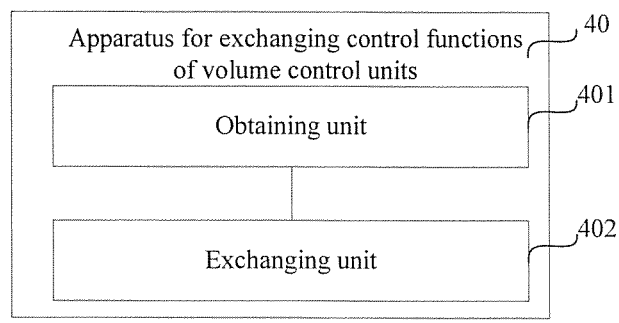
FIG. 6 is a schematic diagram of an apparatus for exchanging control functions of volume control units according to a second embodiment of the present invention.

Correspondingly, a second embodiment of the present invention further provides an apparatus 40 for exchanging control functions of volume control unit; as shown in FIG. 6, the apparatus includes:

an obtaining unit 401, configured to obtain current placement status information of a terminal, where the placement status information is used to indicate a current placement status of the terminal, and at least two volume control units are disposed in the terminal; and an exchanging unit 402, configured to exchange volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease.

In an apparatus 40 for exchanging control functions of volume control units provided by the second embodiment of the present invention, firstly, an obtaining unit 401 obtains current placement status information of a terminal, where the placement status information is used to indicate a current placement status of the terminal, and at least two volume control units are disposed in the terminal; then, an exchanging unit 402 exchanges volume control functions of the at least two volume control units when the current placement status of the terminal deviates from a normal placement status of the terminal, where the at least two volume control units include a volume control unit whose volume control function is to control volume to increase and a volume control unit whose volume control function is to control volume to decrease. In the prior art, a user needs to, if control functions of volume control units are fixed and before adjusting volume, determine, in a current placement status of the terminal, a specific position of a volume control unit for increasing a volume or for decreasing volume. It can be learned from the foregoing description that, unlike the prior art, an apparatus for exchanging the volume control functions of the volume control units, the control functions of the volume control units change along with the placement status of the terminal, thereby making it more convenient for the user to adjust volume.

Figure 7:
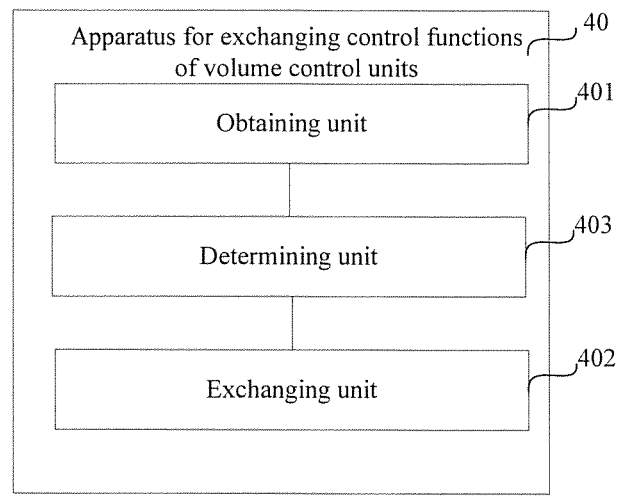
FIG. 7 is another schematic diagram of an apparatus for exchanging control functions of volume control units according to a second embodiment of the present invention.

Optionally, in an embodiment of the present invention, as shown in FIG. 7, the apparatus further includes:

a determining unit 403, configured to determine, according to the placement status information obtained by the obtaining unit 401, whether the current placement status of the terminal deviates from the normal placement status of the terminal.

Optionally, in an embodiment of the present invention, when a screen of the terminal is perpendicular to the horizontal plane, a placement status of the terminal is the normal placement status of the terminal; and the placement status information includes a deviation angle of the terminal, where the deviation angle is an included angle between a line of gravity and a median line of the terminal.

In this case, the determining unit 403 is specifically configured to: when the deviation angle of the terminal is greater than 0 degrees, determine that the current placement status of the terminal deviates from the normal placement status of the terminal.

Optionally, in an embodiment of the present invention, when a screen of the terminal tilts relative to the horizontal plane and a degree of inclination of the terminal is less than 45 degrees, a placement status of the terminal is the normal placement status of the terminal; the placement status information includes a deviation angle of the terminal, where the deviation angle is an included angle between a line of gravity and a median line of the terminal.

In this case, the determining unit 403 is specifically configured to: when the deviation angle of the terminal is greater than or equal to 45 degrees, determine that the current placement status of the terminal deviates from the normal placement status of the terminal.

Further, in an embodiment of the present invention, the exchanging unit 402 is specifically configured to:

exchange the volume control functions of the two volume control units when the current placement status of the terminal deviates from the normal placement status of the terminal, where the at least two volume control units include a first volume control subunit whose volume control function is to control volume to increase and a second volume control subunit whose volume control function is to control volume to decrease.

Optionally, in an embodiment of the present invention, the exchanging unit 402 is specifically configured to:

exchange the volume control functions of the at least two volume control units when the current placement status of the terminal deviates from the normal placement status of the terminal, where the at least two volume control units include a first volume control subunit whose volume control function is to control volume to increase, a second volume control subunit whose volume control function is to control volume to decrease, and a third volume control subunit whose volume control function is to control volume to mute.

Optionally, in an embodiment of the present invention, the placement status information includes a gravity sensing parameter (X, Y, Z) of the terminal, where X, Y, and Z indicate component values of gravity accelerations generated by the terminal in the X-axis direction, the Y-axis direction, and the Z-axis direction, respectively, where when an included angle between a line of gravity and a median line of the terminal is 0 degrees, the gravity sensing parameter (X, Y, Z) of the terminal is (0, −10, 0), (0, 10, 0), (−10, 0, 0), or (10, 0, 0).

In this case, the determining unit 403 is specifically configured to: when the gravity sensing parameter (X, Y, Z) is (0, −10, 0), (0, 10, 0), (−10, 0, 0), or (10, 0, 0), determine that the current placement status of the terminal is the normal placement status of the terminal.

Optionally, in an embodiment of the present invention, the placement status information includes a gravity sensing parameter (X, Y, Z) of the terminal, where X, Y, and Z indicate component values of gravity accelerations generated by the terminal in the X-axis direction, the Y-axis direction, and the Z-axis direction, respectively, where when an included angle between a line of gravity and a median line of the terminal is less than 45 degrees, in the gravity sensing parameter (X, Y, Z) of the terminal, a Y value is greater than −5 and less than 5, or an X value is greater than −5 and less than 5.

In this case, the determining unit 403 is specifically configured to: when in the gravity sensing parameter (X, Y, Z), the Y value is greater than −5 and less than 5, or the X value is greater than −5 and less than 5, determine that the current placement status of the terminal is the normal placement status of the terminal.

Further, in an embodiment of the present invention, the exchanging unit 402 is specifically configured to:

exchange the volume control functions of the two volume control units when the current placement status of the terminal deviates from the normal placement status of the terminal, where the at least two volume control units include a first volume control subunit whose volume control function is to control volume to increase and a second volume control subunit whose volume control function is to control volume to decrease.

Optionally, in an embodiment of the present invention, the exchanging unit 402 is specifically configured to:

exchange the volume control functions of the at least two volume control units when the current placement status of the terminal deviates from the normal placement status of the terminal, where the at least two volume control units include a first volume control subunit whose volume control function is to control volume to increase, a second volume control subunit whose volume control function is to control volume to decrease, and a third volume control subunit whose volume control function is to control volume to mute.

It should be noted that, reference may be made to the foregoing method embodiments for specific functions of structural units of the apparatus 40 for exchanging control functions of volume control units provided by this embodiment of the present invention. Reference may also be made to the description of the foregoing method embodiments for meanings of parameters in the gravity sensing parameter.

Figure 8:
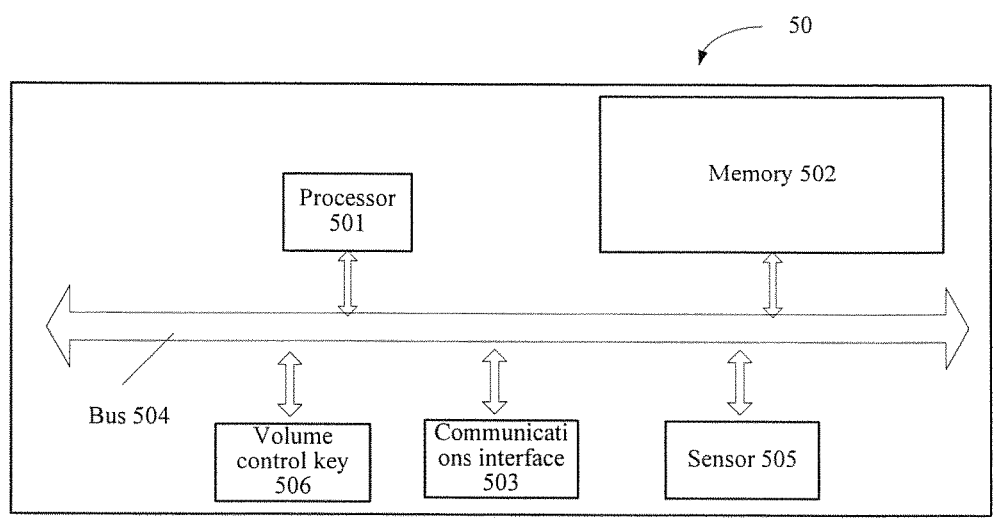
FIG. 8 is a schematic diagram of an apparatus for exchanging control functions of volume control units according to a third embodiment of the present invention.

FIG. 8 shows an embodiment of an apparatus for exchanging control functions of volume control units provided by a third embodiment of the present invention; as shown in FIG. 8, the apparatus 50 for exchanging volume control functions of a terminal provided by this embodiment includes a processor 501, a memory 502, a communications interface 503, a bus 504, a sensor 505, and a volume control key 506. The processor 501, the memory 502, the sensor 505, the volume control key 506, and the communications interface 503 are connected and communicate with each other by using the bus 504. The bus 504 may be an Industry Standard Architecture (Industry Standard Architecture, ISA for short) bus, a Peripheral Component Interconnect (Peripheral Component Interconnect, PCI for short) bus, an Extended Industry Standard Architecture (Extended Industry Standard Architecture, EISA for short) bus, or the like. The bus 504 may be classified into an address bus, a data bus, a control bus, and the like. For ease of denotation, the bus is represented by using one thick line in FIG. 8; however, it does not indicate that there is only one bus or only one type of bus.

The sensor 505 is configured to obtain current placement status information of the terminal.

There are at least two volume control keys 506, which are configured to adjust volume.

The memory 502 is configured to store executable program code, where the program code includes computer operation instructions. The memory 502 may include a high-speed RAM memory, and may also include a non-volatile memory (non-volatile memory), such as at least one disk memory.

The processor 501 runs a program corresponding to the executable program code by reading the executable program code stored in the memory 502, so as to:

exchange volume control functions of at least two volume control units when the current placement status of the terminal deviates from a normal placement status of the terminal, where the at least two volume control units include a volume control unit whose volume control function is to control volume to increase and a volume control unit whose volume control function is to control volume to decrease.

The processor 501 may be a central processing unit (Central Processing Unit, CPU for short), or an application-specific integrated circuit (Application Specific Integrated Circuit, ASIC for short), or be configured to be one or more integrated circuits implementing the embodiments the present invention.

It should be noted that the processor 501, in addition to having the functions described above, may be further configured to implement other procedures in the method embodiments, and details are not described repeatedly herein.

It should be further noted that reference may be made to the embodiment of the foregoing apparatus for exchanging control functions of volume control units for division of functional units in the processor 501, which is not described in this embodiment.

Correspondingly, a fourth embodiment of the present invention further provides a terminal, where the terminal includes at least two volume control units and the apparatus for exchanging control functions of volume control units according to any one embodiment of the foregoing embodiments for exchanging control functions of volume control units.

Each embodiment in this specification is described in a progressive manner. Same or similar parts in the embodiments are just references to each other. Every embodiment illustrates in emphasis what is different from the other embodiments. In particular, for the apparatus embodiment, because it is basically similar to the method embodiment, the apparatus embodiment is described simply, and the relevant part may be obtained with reference to the part of the description of the method embodiment.

It should be noted that the described apparatus embodiment is merely exemplary. The units described as separate parts may or may not be physically separate, and parts displayed as units may or may not be physical units, may be located in one position, or may be distributed on a plurality of network units. A part or all of the modules may be selected according to actual needs to achieve the objectives of the solutions of the embodiments. In addition, in the accompanying drawings of the apparatus embodiments provided by the present invention, a connection relationship between units indicates that a communication connection exists between them, which may be specifically implemented as one or more communications buses or signal cables. A person of ordinary skill in the art may understand and implement the embodiments without creative efforts.

Based on the description of the foregoing implementation manners, a person skilled in the art may clearly understand that the present invention may be implemented by software in addition to necessary universal hardware, or by dedicated hardware, including dedicated integrated circuit, dedicated CPU, dedicated memory, dedicated component, and the like. Generally, any functions that can be performed by a computer program can be easily implemented by using corresponding hardware. Moreover, a specific hardware structure used to achieve a same function may be of various forms, for example, in a form of an analog circuit, a digital circuit, a dedicated circuit, or the like. However, as for the present invention, software program implementation is a better implementation manner in most cases. Based on such understandings, the essence of the technical solutions of the present invention or the part that makes contributions to the prior art can be embodied in a software product. The computer software product may be stored in a readable storage medium such as a computer floppy disk, a USB flash drive, a mobile hard disk, a read-only memory (ROM, Read-Only Memory), a random access memory (RAM, Random Access Memory), a magnetic disk, or an optical disc, where the storage medium incorporates several instructions causing a computer device (such as a personal computer, a server, or a network device) to perform the method specified in each embodiment of the present invention.

The foregoing descriptions are merely specific implementation manners of the present invention, but are not intended to limit the protection scope of the present invention. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A method for exchanging control functions of volume control units, wherein the method comprises:
    obtaining current placement status information of a terminal, wherein the placement status information is used to indicate a current placement status of the terminal, and at least two volume control units are disposed in the terminal;
    determining, according to the placement status information, whether the current placement status of the terminal deviates from a normal placement status of the terminal; and
    exchanging volume control functions of the at least two volume control units when the current placement status of the terminal deviates from the normal placement status of the terminal, wherein the at least two volume control units comprise a volume control unit whose volume control function is to control volume to increase and a volume control unit whose volume control function is to control volume to decrease;
    wherein when a screen of the terminal tilts relative to a horizontal plane and a degree of inclination of the terminal is less than 45 degrees, a placement status of the terminal is the normal placement status of the terminal;
    wherein the placement status information comprises a deviation angle of the terminal, wherein the deviation angle is an included angle between a line of gravity and a median line of the terminal; and
    wherein determining, according to the placement status information, whether the current placement status of the terminal deviates from the normal placement status of the terminal comprises:
        when the deviation angle of the terminal is greater than or equal to 45 degrees, determining that the current placement status of the terminal deviates from the normal placement status of the terminal.

2. The method according to claim 1, wherein the exchanging volume control functions of the at least two volume control units when the current placement status of the terminal deviates from a normal placement status of the terminal, wherein the at least two volume control units comprise a volume control unit whose volume control function is to control volume to increase and a volume control unit whose volume control function is to control volume to decrease comprises:
    exchanging the volume control functions of the at least two volume control units when the current placement status of the terminal deviates from the normal placement status of the terminal, wherein the at least two volume control units comprise a first volume control subunit whose volume control function is to control volume to increase and a second volume control subunit whose volume control function is to control volume to decrease.

3. The method according to claim 1, wherein the exchanging volume control functions of the at least two volume control units when the current placement status of the terminal deviates from a normal placement status of the terminal, wherein the at least two volume control units comprise a volume control unit whose volume control function is to control volume to increase and a volume control unit whose volume control function is to control volume to decrease comprises:
    exchanging the volume control functions of the at least two volume control units when the current placement status of the terminal deviates from the normal placement status of the terminal, wherein the at least two volume control units comprise a first volume control subunit whose volume control function is to control volume to increase, a second volume control subunit whose volume control function is to control volume to decrease, and a third volume control subunit whose volume control function is to control volume to mute.

4. An apparatus for exchanging control functions of volume control units, wherein the apparatus comprises:
    an obtaining unit, configured to obtain current placement status information of a terminal, wherein the placement status information is used to indicate a current placement status of the terminal, and at least two volume control units are disposed in the terminal;
    a determining unit, configured to determine, according to the placement status information obtained by the obtaining unit, whether the current placement status of the terminal deviates from a normal placement status of the terminal; and
    an exchanging unit, configured to exchange volume control functions of the at least two volume control units when the current placement status of the terminal deviates from the normal placement status of the terminal, wherein the at least two volume control units comprise a volume control unit whose volume control function is to control volume to increase and a volume control unit whose volume control function is to control volume to decrease;
    wherein when a screen of the terminal tilts relative to a horizontal plane and a degree of inclination of the terminal is less than 45 degrees, a placement status of the terminal is the normal placement status of the terminal;
    wherein the placement status information comprises a deviation angle of the terminal, wherein the deviation angle is an included angle between a line of gravity and a median line of the terminal; and
    wherein the determining unit is configured to:

determine that the current placement status of the terminal deviates from the normal placement status of the terminal when the deviation angle of the terminal is greater than or equal to 45 degrees.

5. The apparatus according to claim 4, wherein the exchanging unit is configured to:

exchange the volume control functions of the at least two volume control units when the current placement status of the terminal deviates from the normal placement status of the terminal, wherein the at least two volume control units comprise a first volume control subunit whose volume control function is to control volume to increase and a second volume control subunit whose volume control function is to control volume to decrease.

6. The apparatus according to claim 4, wherein the exchanging unit is configured to:

exchange the volume control functions of the at least two volume control units when the current placement status of the terminal deviates from the normal placement status of the terminal, wherein the at least two volume control units comprise a first volume control subunit whose volume control function is to control volume to increase, a second volume control subunit whose volume control function is to control volume to decrease, and a third volume control subunit whose volume control function is to control volume to mute.

* * * * *